(12) United States Patent
Perevoztchikov et al.

(10) Patent No.: US 8,749,917 B1
(45) Date of Patent: Jun. 10, 2014

(54) ADJUSTABLE DISK STABILIZER FOR A SPINSTAND

(71) Applicant: Guzik Technical Enterprises, Mountain View, CA (US)

(72) Inventors: Konstantin Perevoztchikov, Saratoga, CA (US); Wei Zhuang, San Francisco, CA (US); Nahum Guzik, Mountain View, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 13/856,747

(22) Filed: Apr. 4, 2013

(51) Int. Cl.
*G11B 5/84* (2006.01)
*G01R 33/12* (2006.01)

(52) U.S. Cl.
USPC .......................... 360/99.12; 360/137; 324/210

(58) Field of Classification Search
USPC ............ 360/99.08, 99.12, 137; 324/210, 212, 324/261, 262
See application file for complete search history.

(56) References Cited

U.S. PATENT DOCUMENTS

| | | | |
|---|---|---|---|
| 5,491,413 A * | 2/1996 | Guzik | 324/212 |
| 6,229,304 B1 * | 5/2001 | Guzik | 324/212 |
| 6,483,300 B1 * | 11/2002 | Severson et al. | 324/212 |
| 6,566,870 B2 * | 5/2003 | Sorenson et al. | 324/210 |
| 7,141,969 B2 * | 11/2006 | Guzik | 324/261 |
| 7,295,002 B2 * | 11/2007 | Guzik et al. | 324/212 |
| 7,467,479 B2 * | 12/2008 | Guzik et al. | 33/613 |
| 7,768,740 B2 * | 8/2010 | Pettman et al. | 360/99.08 |
| 7,880,463 B2 * | 2/2011 | Guzik et al. | 324/212 |
| 7,954,119 B2 * | 5/2011 | Warn et al. | 720/703 |
| 2005/0219966 A1 * | 10/2005 | Ishimoto et al. | 369/30.27 |
| 2006/0103382 A1 * | 5/2006 | Mihara et al. | 324/262 |
| 2007/0040552 A1 * | 2/2007 | Ishimoto | 324/261 |

* cited by examiner

*Primary Examiner* — Brian Miller
(74) *Attorney, Agent, or Firm* — Burns & Levinson LLP; Joseph M. Maraia

(57) ABSTRACT

An adjustable disk stabilizer for a spinstand having a spindle motor and spindle assembly for supporting and rotating a magnetic medium bearing disk. The spinstand is adapted to position a transducing (read/write) head adjacent to the magnetic medium. The adjustable disk stabilizer is attached to a stationary portion of the spindle assembly, and includes a mechanism to adjust height and alignment of a plate having a bearing surface opposite a non-magnetic-media-bearing undersurface of the disk. That bearing surface, in concert with the undersurface of the disk, establishes a supporting air bearing therebetween during rotation of the media-bearing disk. The adjustment mechanism enables easily-attained compensation for various disk-to-disk thicknesses and level imperfections of the bearing surface plate mounting, and enables precision alignment of the bearing surface of the plate to the surface of the disk opposite to the surface under test.

9 Claims, 6 Drawing Sheets

ADJUSTABLE DISK STABILIZER FOR A SPINSTAND

FIELD OF THE TECHNOLOGY

The technology is in the field of magnetic data recording devices, and more particularly relates to devices for testing and measuring various aspects and properties of magnetic hard disk drives.

BACKGROUND

Test devices known as spinstands are used to test and evaluate magnetic disks and magnetic heads used in hard disk drives, as well as other structural and functional components of drives. The disks generally include a relatively rigid disk having two parallel planar principle surfaces, and bearing a magnetic medium on at least one of the principle surfaces. In the spinstand, a spindle is driven by a motor to rotate about a disk axis, as data is written to and read from the disk, and evaluated. At such rotation rates, it is important to maintain mechanical stability of the disk, minimizing vibration, so that desired test procedures can be applied, and accurate testing measurements can be obtained.

It also is important to be able to reconfigure a spinstand relatively quickly, for example, on a factory floor, so that various thickness magnetic media disks can be tested in succession on a given spinstand. For example, it may be necessary to analyze disks of a first thickness X, followed by disks of second thickness Y, followed by disks of a third thickness Z.

In accordance with prior art, a disk-under-test is placed on a chuck and clamped by a chuck cap to the spindle. The spindle is driven to rotate about a spin axis of the spinstand by the drive motor.

In conventional practice to maintain stability of a rotating disk on a spinstand, a plate having an at least "nominally" flat bearing surface is disposed opposite and preferably parallel to the planar underside of the disk, maintaining a small gap G, between the bearing surface and the planar underside of the disk. Hard drives use a gap between 0.005 inch and 0.010 inch. Smaller gaps are harder to achieve in mass production and the spindle motor draws a lot of power with such gaps. As "nominally" flat, the bearing surface may be smooth (for example, highly polished planar), or it may be textured, but is considered "nominally" flat, or just "flat" as used herein.

With such a configuration, an air bearing is established between the planar underside of the disk-under-test and the bearing surface, providing a high degree of mechanical stability, minimizing vibration of the disk, during the test process. In accordance with conventional practice, a spinstand is set up to accommodate a disk of a given thickness so that the underside of the disk is opposite the bearing surface, with the bearing surface being parallel to the underside and with a desired gap G between the bearing surface and the underside of the disk.

There are, however, at least two significant problems with such practice.

First, it is very difficult, and time-consuming and thus costly, to establish such a parallel configuration for a first disk-under-test having a first thickness and/or diameter. Generally, in the prior art, a support structure for a given disk is typically composed of multiple elements, including shims, for fine adjustments.

Second, when testing a succession of disks, after testing the first disk, the repetition of those alignment steps is required to establish a similar configuration for a second disk-under-test of a different thickness and/or diameter. Generally, in the prior art, in order to accommodate a succession of differing thickness and/or diameter disks, an entire assembly for supporting the plate having the bearing surface, must be reconfigured to accommodate the various thicknesses and/or diameter of the disks in the succession.

In view of the need to continually develop equipment and methodologies suitable for effecting cost-efficient design and testing of magnetic read/write heads and disks, it is increasingly important to provide a solution to the above noted difficulties.

SUMMARY

A spinstand is an instrument that is used for testing the characteristics of magnetic read/write heads and disks. The spinstand generally simulates the motions of the head with respect to a disk that occur in a hard disk drive. The spinstand includes a support and rotational driver for a magnetic disk-to-be-tested.

An adjustable disk stabilizer for an exemplary spinstand is disclosed below where the spinstand includes a spindle motor and spindle assembly extending from a base, for supporting a disk in a disk locus extending transverse to and about a spindle axis. The disk typically has two mutually parallel planar annular principal surfaces, at least one of the principal surfaces bearing a magnetic medium. In a form, the disk is to be supported in the disk locus with the at least one of the magnetic medium-bearing principal surfaces facing away from the base. The spindle motor and spindle assembly spin the disk about the spindle axis at high speed.

In a manner similar to the prior art, the disclosed configuration includes a plate, preferably having a "nominally" flat (or just "flat", as the term is used herein) bearing surface, with the bearing surface positioned opposite the underside of a disk-under-test and facing away from the base, during the testing/measurement process. In a form, the goal of that configuration is similar to that as discussed above in connection with the prior art, namely, to have the bearing surface of the plate parallel to, and separated by a small gap G from, the underside of the disk clamped by the chuck cap to the spindle in the disk locus, so that an air bearing is established by the undersurface of the rotating disk and the bearing surface opposite thereto.

The disclosed adjustable disk stabilizer support structure for the disk stabilizer plate including the bearing surface, is significantly different from, and a substantial improvement over, prior art disk stabilizer support structures for disks on spinstands.

In a form, the disclosed adjustable disk stabilizer support structure generally includes (i) a plate support element disposed about the spin axis and resiliently coupled to the base of the spinstand, and (ii) a selected disk stabilizer plate having a nominally flat, in some cases smooth planar, bearing surface and having an axial thickness related to the thickness of a disk-to-be-tested. When so configured, the plate support element has an upper surface facing the disk locus and extending perpendicular to the spin axis and about an end member of the spindle which is distal to the spindle motor. The selected disk stabilizer plate is affixed to that upper surface facing the disk locus, with its bearing surface facing the disk locus.

In a form, the plate support element is resiliently coupled to the spinstand base by n alignment fasteners, such as cap screws, where each fastener extends from the plate support element, through a preloaded compression element (such as a compression washer, for example in the form of a Belleville washer), and engages a threaded hole in a structure rigidly coupled to the base of the spinstand. In a preferred form, n=3, but other numbers of fasteners can be used.

In use, the fasteners resiliently coupling the plate support element to the base of the spinstand, are adjusted to establish compression of the compression elements, preferably at or near the middle of their adjustment range.

For testing a disk-to-be-tested having a known/measured thickness, a disk stabilizer plate having a nominally flat or planar bearing surface, is selected for fixture to the planar upper surface of the plate support element. The disk stabilizer plate is selected to achieve desirable gap G between flat surface and the disk-under-test within adjustment range. The disk stabilizer plate is also selected for diameter, since in order to establish a stable air bearing between the underside of a disk-under-test and the bearing surface of the disk stabilizer plate, it is important the opposed surfaces are substantially matched in size.

In a form, the disk stabilizer plate includes through-holes arranged so that when the disk stabilizer plate is affixed to the plate support element, as described, those through-holes permit access by a user to the alignment fasteners which resiliently couple the plate support element via the compression elements, to the spinstand base.

The disk to-be-tested is then mounted to the end member of the spindle, and clamped to the spindle end member (for example, by a chuck cap similar to those used in spinstands of the prior art). The spindle, chuck and chuck cap establish for the media-bearing disk clamped thereto, that the mutually parallel principal surfaces of the disk are disposed perpendicular to the spindle axis.

According to an aspect of the technology, of the various elements of the disclosed adjustable disk stabilizer assembly, only the bearing surface of the disk stabilizer plate needs to be machined or otherwise produced in a relatively high precision manner. The element-to-element surfaces of the disk stabilizer assembly can be produced in a relatively low precision manner. This important attribute of the disclosed adjustable disk stabilizer assembly is enabled by the selection of the thickness of the plate support element whereby, when the disk stabilizer plate is affixed to the plate support element, the bearing surface of the disk stabilizer is (i) approximately perpendicular to the spin axis, and (ii) positioned along the spin axis so that when the disk-to-be-tested is mounted to the spindle end member by the chuck assembly, the underside of the disk is separated from the bearing surface of the disk stabilizer by a gap G, as desired.

Thus, the disclosed adjustable disk stabilizer is used to enable a simple user-adjustment (for example, requiring adjustment of only three cap screws using wrench W of FIG. 2) to the disk stabilizer plate to ensure that the bearing surface of the plate is parallel to the underside of the supported disk, as well as at a position along the spin axis so that a desired highly uniform gap G is established.

As compared to the prior art configurations and methods, in a form, the simple adjustment of three cap screws to achieve proper alignment, is highly efficient and can be done in shorter period of time compared to prior art.

Moreover, in order to test a disk of a second thickness and/or diameter after testing a disk of a first thickness and/or diameter, the operator merely has to remove the first disk, replace the disk stabilization plate with one corresponding to the thickness of the second disk to be tested, and/or diameter, and re-adjust the same three cap screws by an amount necessary for the media-bearing surface of the second disk to be at the desired offset from the reference plane, taking into account the thickness of the second disk. When so configured, testing of the disk may commence.

Again, as compared to the prior art configurations and methods, the simple replacement of the top plate, adjustment of three cap screws to achieve proper alignment for testing a succession of disks of differing thicknesses and/or diameter, is highly efficient.

These and various other features as well as advantages of present technology will be apparent upon reading of the following detailed description and review of associated drawings.

BRIEF DESCRIPTION OF THE DRAWING

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

DETAILED DESCRIPTION

Figure 2:
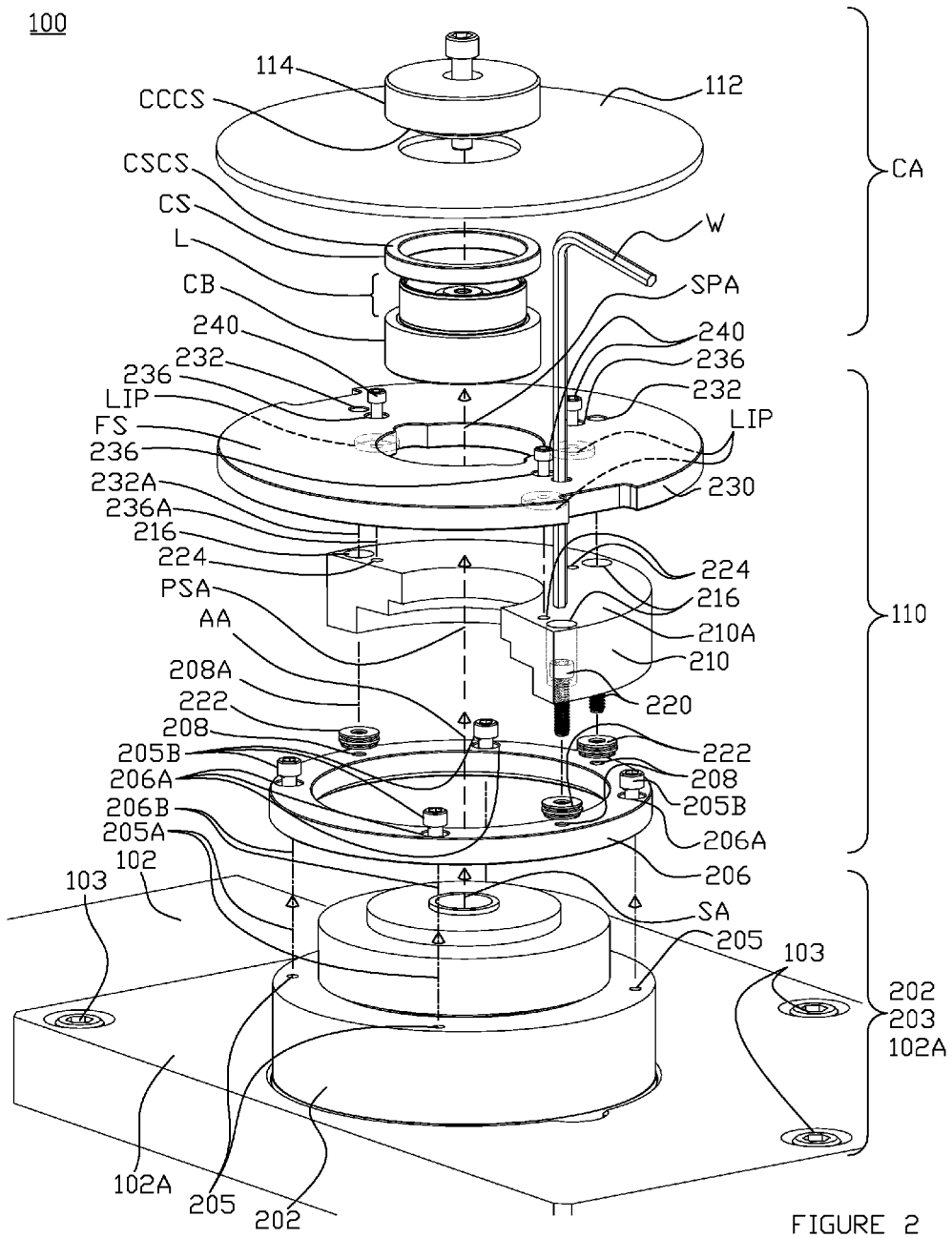
FIG. 2 shows an exploded view of a spindle assembly for a spinstand, including an adjustable disk stabilizer in accordance with an example embodiment of the present disclosure.
Figure 3:
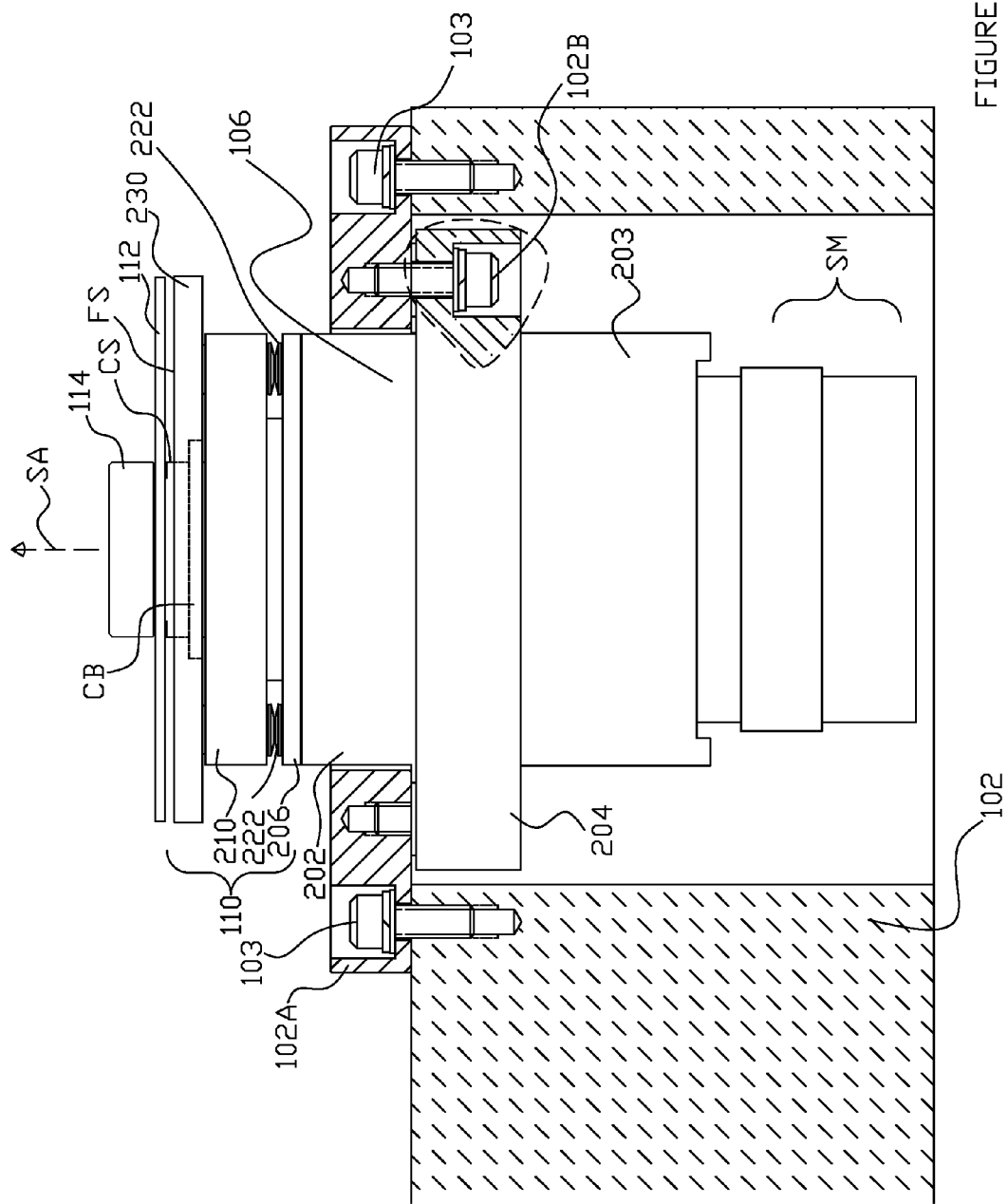
FIG. 3 shows, partly in section, a side view of the spindle assembly of FIG. 2 including the adjustable disk stabilizer, mounted on the spindle base and spinstand base of the spinstand of FIG. 2, in accordance with an example embodiment of the present disclosure.

An exemplary disk support assembly 100 for a spinstand, is shown in FIGS. 2-3, positioned with respect to a spinstand base 102. The disk support assembly 100 includes a spindle assembly 106, an exemplary disk stabilizer assembly 110, a chuck assembly CA, and a supported magnetic media-bearing disk 112.

Figure 1:
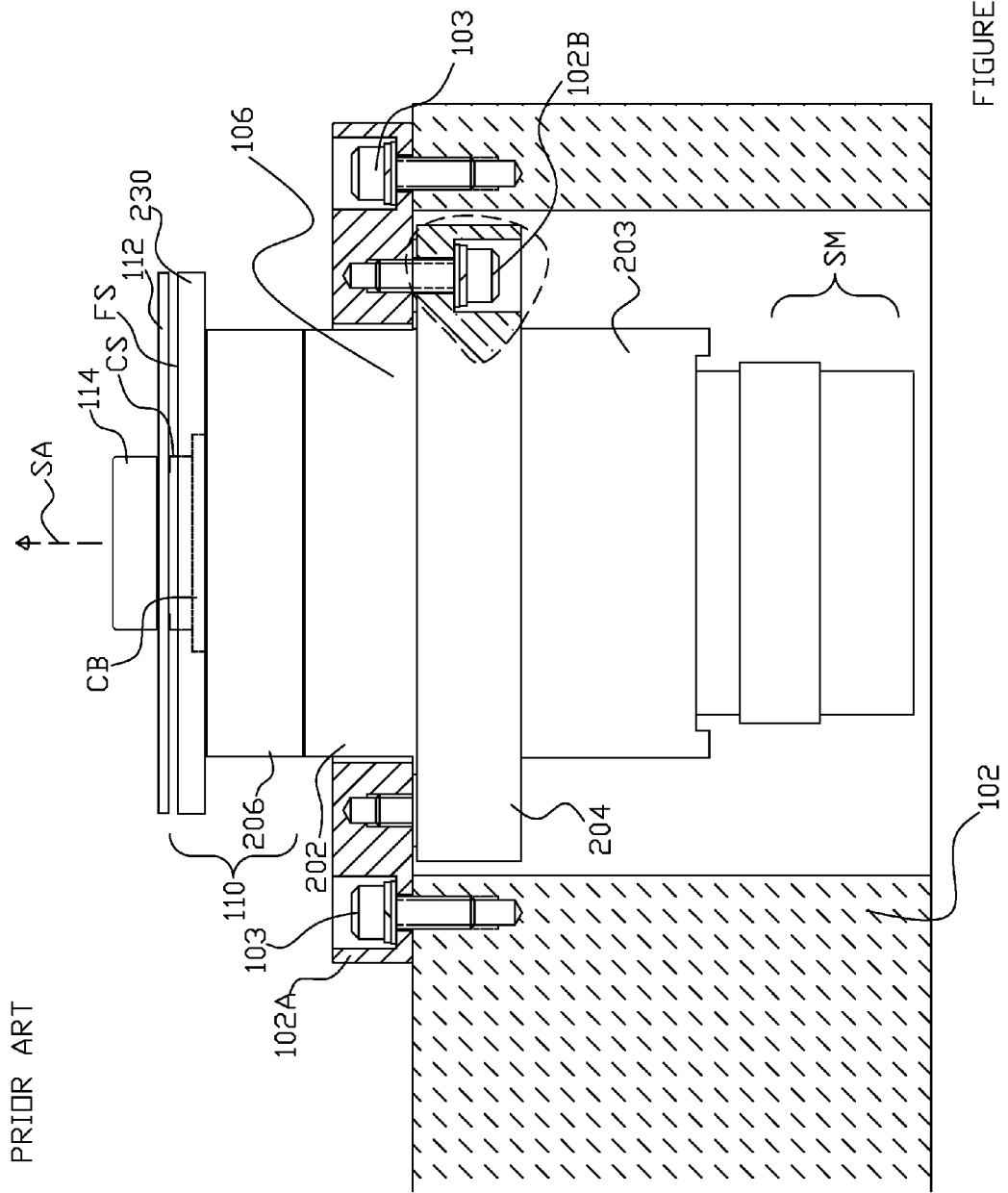
FIG. 1 shows prior art of disk stabilizer.

The spindle assembly 106 includes a spindle motor SM (shown in FIGS. 1 and 3 only), a spindle support housing 203, a spindle coupling ring 204 (shown in FIG. 3 only) disposed about and rigidly affixed to the housing 203, and a spindle base 102A rigidly affixed to the spinstand base 102 by spindle base screws 103. The spindle motor SM is adapted to rotate the spindle end member 202 with respect to the spinstand base 102 about a spin axis SA.

The chuck CA includes a chuck base CB, a chuck spacer CS and a chuck cap 114. The lower end of the chuck base CB is coupled to a distal (distal with respect to spindle motor SM) spindle end member 202 of spindle assembly 106. The chuck cap 114 is removably attachable, to chuck base CB in a manner permitting capture and support of magnetic disk 112 in a disk locus L disposed along the spindle axis SA of the spindle assembly 106.

When fully assembled, elements SM, 203, 110 and CA are all disposed serially along the spindle axis SA. Those elements may be first assembled as an integral unit to form the spindle assembly 106, and then affixed (via screws 103, spindle base 102A, screws 102B and spindle coupling ring 204) to the spinstand base 102, prior to use in the spinstand 100.

In use, the spindle end member 202 is selectively driven (by spindle motor SM) to rotate about spindle axis SA relative to the spindle housing 203. The spindle assembly 106 supports magnetic disk 112, which is clamped to spindle end member 202 by chuck assembly CA. The spindle motor SM is adapted to selectively spin the spindle about the spindle axis SA in operation.

In the illustrated form, the spindle housing 203 threaded adapter tap holes 205 extending along respective adapter tap axes 205A parallel to the spindle axis SA. An annular adapter element 206 is rigidly coupled to spindle end member 202 and is disposed about the drive shaft. In alternative embodiments, for example, without an adapter element 206, the alignment tap holes 208 extend into the spindle base 102A or directly into spinstand base 102.

An annular plate support element 210 overlies the adapter element 206 with the plate support axis PSA being at least approximately coaxial with the spindle axis SA, at least during set-up of a disk 112 to be tested. The plate support element 210 includes alignment through-holes 216 extending parallel to the plate support axis PSA. Alignment cap screws 220 in each of the alignment through-holes 216 extend from the plate support element 210, through a compression element 222 (such as a pre-loaded compression washer), and are threaded into an associated one of the alignment tap holes 208.

The alignment cap screws effect a substantial compression force on the respective compression elements 222, so that the annular support element 210 is positioned with the compression elements 222 under load, with the plate support axis PSA being substantially, but not necessarily fully, but adjustably, coaxial with the spindle axis SA.

Figure 4:
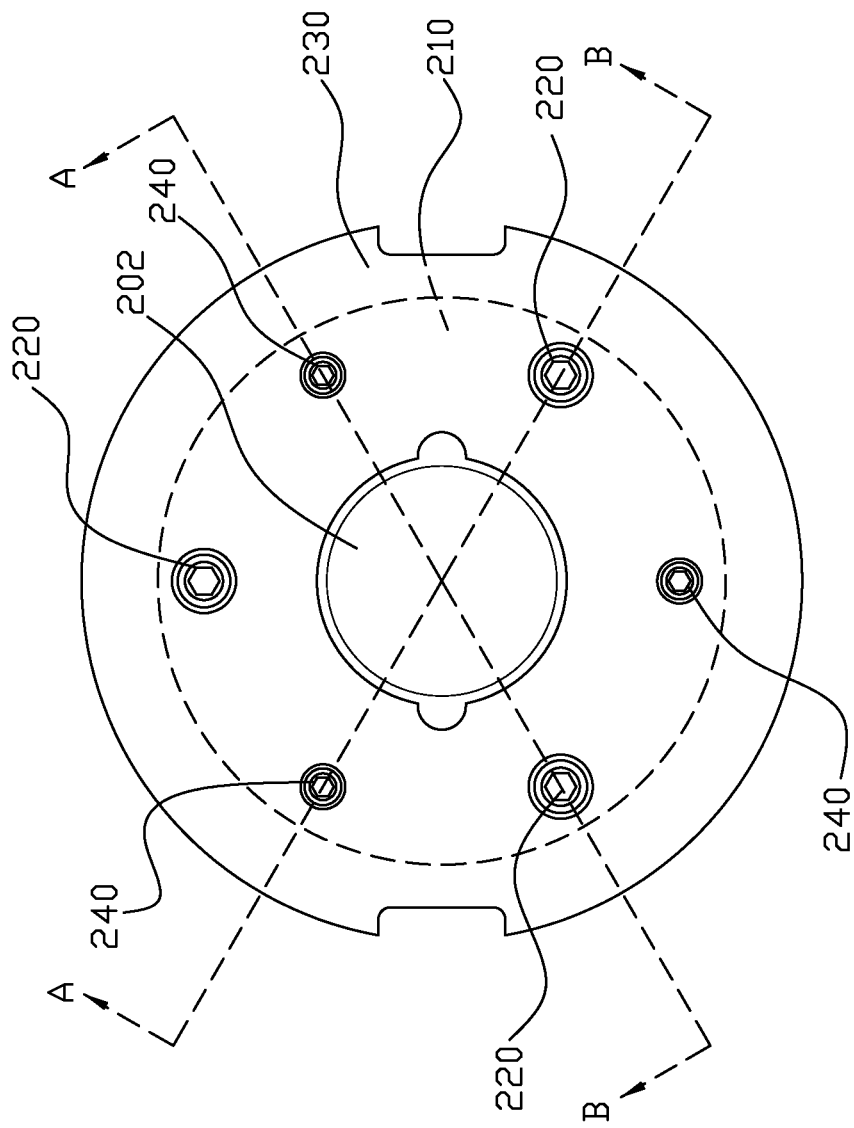
FIG. 4 shows a top view of an alternative embodiment for the adjustable disk stabilizer of FIGS. 2-3.
Figure 5A:
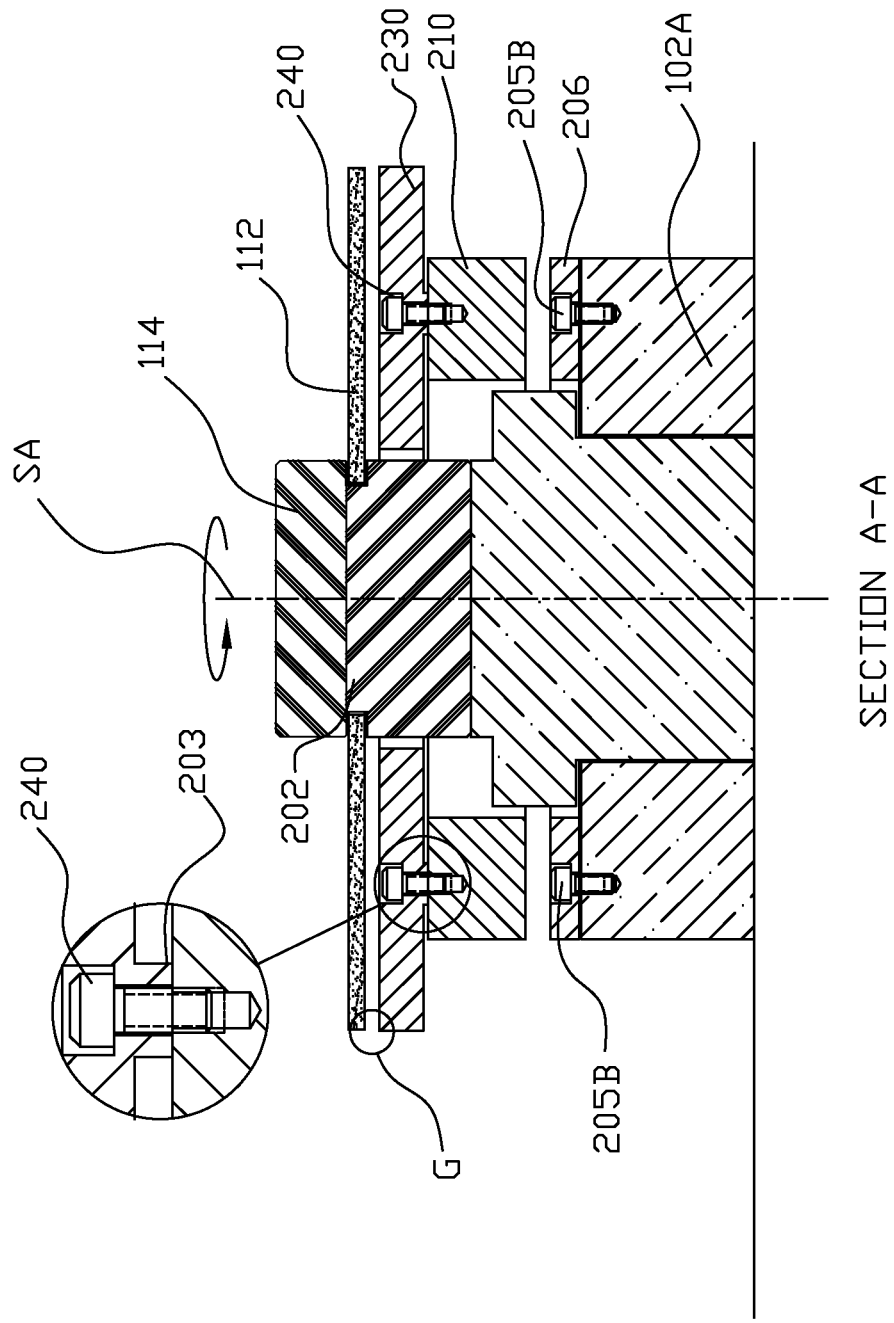
FIG. 5A shows a sectional view along A-A of the adjustable disk stabilizer of FIG. 4.
Figure 5B:
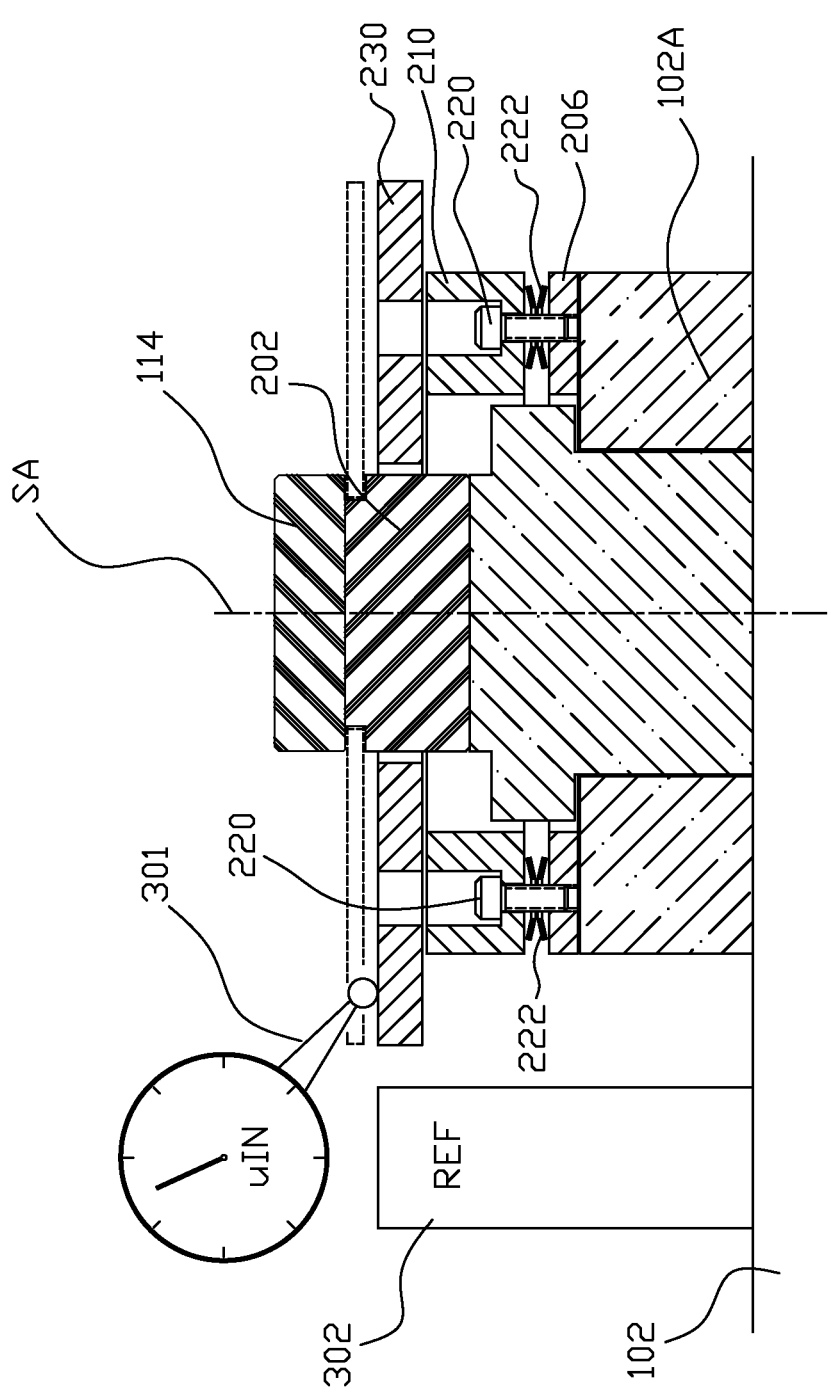
FIG. 5B shows a sectional view along B-B of the adjustable disk stabilizer of FIG. 4.

The annular plate support element 210 further includes threaded plate coupling holes 224 into the plate support element 210. Different hole-spacing and distribution configurations are used in other embodiments. In the embodiments of FIGS. 4-5B, for example, the plate coupling holes 224 are interspersed with the alignment through-holes 216.

An annular disk stabilizer plate 230 extending about a stabilizer plate axis SPA preferably has a bearing surface FS (first principal end surface) on one major face. The disk stabilizer plate 230 is disposed between the plate support surface 210A of the annular plate support element 210 and the disk locus L and chuck cap 114, so that the stabilizer plate axis SPA is approximately, but not necessarily fully, coaxial with the spindle axis SA with the bearing surface FS opposite the disk locus L. The stabilizer plate and support element can be integral.

In the illustrated form, the disk stabilizer plate 230 further includes plate coupling through-holes 236 can be angularly positioned so that both the respective stabilizer alignment axes of the disk stabilizer plate 230 and the plate support element 210 and the respective base alignment axes 208A are all coaxial, and plate coupling axes 236A of the disk stabilizer plate 230 are coaxial with the respective plate coupling axes 224A of the plate support element 210.

A set of fasteners, for example screws, and in some cases, coupling cap screws 240, extend through the plate coupling holes 236 of the disk stabilizer plate 230 and are threaded into the respective plate coupling holes 224, thereby affixing the disk stabilizer plate 230 to the plate support element 210 with the support plate axis SPA at or near coaxial with the spindle axis SA.

With this configuration, a disk 112 may be disposed in disk locus L of spinstand and secured to the spindle end member 202 by the chuck assembly CA, and tested. Generally, a disk 112 to be tested, has a magnetic media-bearing upper surface and a parallel planar under surface, and has a uniform thickness between the upper surface and under surface.

Thus, uniformity of the gap G, together with accommodation of various thickness disks, is achieved by selection of an appropriate stabilizer plate and a simple adjustment of the three alignment cap screws 220, providing the ability to easily adjust the gap G and also to accommodate a succession of varying thickness disks with minimal effort.

One skilled in the art will realize that the embodiments of the present disclosure may be embodied in other specific forms without departing from the spirit or essential characteristics thereof. The foregoing embodiments are therefore to be considered in all respects illustrative rather than limiting of the embodiments of the present disclosure described herein. Scope of the embodiments of the present disclosure is thus indicated by the appended claims, rather than by the foregoing description, and all changes that come within the meaning and range of equivalency of the claims are therefore intended to be embraced therein.

What is claimed is:

1. An adjustable disk stabilizer for attachment to a spinstand comprising:
   A. an annular plate support element having an annular plate support surface adapted for positioning about a spin axis of a spinstand with the annular plate support surface facing toward a disk locus,
   B. an annular disk stabilizer plate having a first principal annular end surface and adapted for positioning about a spin axis with the annular end surface wherein the first principal annular end surface is flat and transverse to the spindle axis,
   C. an n-element pre-loaded coupling assembly for coupling the plate support element and disk stabilizer plate to a spinstand, including:
      i. at least one compression element,
      ii. n screw fasteners extending from the disk stabilizer plate, through the plate support element, preloaded by n compression elements, and adapted to be positioned into a spinstand.

2. The adjustable disk stabilizer according to claim 1, wherein n=3.

3. The adjustable disk stabilizer according to claim 2, wherein the compression elements are compression washers.

4. The adjustable disk stabilizer according to claim 3, wherein the compression washers are Belleville washers.

5. The adjustable disk stabilizer according to claim 1, wherein the plate support element and disk stabilizer plate are integral.

6. The adjustable disk stabilizer according to claim 5 wherein the disk stabilizer plate element is a composite element having a stabilizer plate and an annular plate support element underlying and affixed to the stabilizer plate.

7. The adjustable disk stabilizer according to claim 6 further comprises:
   a set of three screws and an associated set of non-threaded through-holes in the plate support element extending in the direction of the stabilizer plate axis, a corresponding set of threaded through holes extending into the plate support element, wherein the screws are adapted to reversibly couple the stabilizer plate element to the plate support element.

8. An adjustable disk stabilizer for a spinstand having a spindle motor and spindle assembly for supporting a disk having mutually parallel annular principal surfaces, with respect to a base underlying the disk, and for rotating the disk about a spindle axis in a disk locus whereby the principal surfaces are perpendicular to the spindle axis with one surface being opposite the base, comprising:

A. an annular disk stabilizer plate element having a flat first principal annular end surface disposed about a stabilizer plate axis, wherein the stabilizer plate is adapted for positioning the flat first principal annular end surface facing the disk locus and disposed about the spindle whereby the first annular end surface is transverse to the spindle axis, B. a three element pre-loaded support assembly including:

i. three radially and angularly distributed plate support through-holes having an inwardly extending lip and extending from the first principal annular end surface through the disk stabilizer plate along respective alignment through-hole axes, wherein the alignment through-hole axes are angularly distributed about the stabilizer plate axis, and ii. three threaded base alignment holes extending into the base from a surface facing the disk locus and extending along respective base alignment axes, wherein the radial and axial distribution of the base alignment axes to the spindle axis is the same as the distribution of the alignment through-hole axes of the disk stabilizer plate, iii. three plate alignment cap screws and associated compression elements, wherein the plate alignment cap screws are adapted for non-engaged insertion through the alignment through-holes of the disk stabilizer plate, non-engaged insertion through the respective compression elements and for threaded engagement with the respective three threaded alignment holes of the base.

9. The adjustable disk stabilizer according to claim 8 wherein the compression elements are compression washers.

\* \* \* \* \*